United States Patent [19]
Richards et al.

[11] Patent Number: 6,121,119
[45] Date of Patent: Sep. 19, 2000

[54] RESISTOR FABRICATION

[75] Inventors: John G. Richards; Hector Flores, both of San Jose, Calif.

[73] Assignee: Chipscale, Inc., San Jose, Calif.

[21] Appl. No.: 08/865,357

[22] Filed: May 29, 1997

Related U.S. Application Data

[62] Division of application No. 08/257,726, Jun. 9, 1994, abandoned.

[51] Int. Cl.⁷ .......................... H01L 21/78; H01L 21/301; H01L 21/46
[52] U.S. Cl. ............................................ 438/462; 438/977
[58] Field of Search .................... 438/460, 462, 438/382, 977; 257/622

[56] References Cited

U.S. PATENT DOCUMENTS

| | | |
|---|---|---|
| 2,954,486 | 9/1960 | Doucette et al. . |
| 3,200,311 | 8/1965 | Thomas et al. . |
| 3,462,655 | 8/1969 | Coblenz . |
| 3,559,282 | 2/1971 | Lesk . |
| 3,566,214 | 2/1971 | Usuda . |
| 3,594,619 | 7/1971 | Kamoshida et al. . |
| 3,602,982 | 9/1971 | Kooi . |
| 3,666,588 | 5/1972 | Wanesky . |
| 3,680,205 | 8/1972 | Kravitz . |
| 3,686,748 | 8/1972 | Engeler et al. . |
| 3,746,945 | 7/1973 | Normington . |
| 3,748,546 | 7/1973 | Allison . |
| 3,754,169 | 8/1973 | Lyon et al. . |
| 3,761,782 | 9/1973 | Youmans . |
| 3,808,470 | 4/1974 | Kniepkamp . |
| 3,820,235 | 6/1974 | Goldman . |
| 3,886,578 | 5/1975 | Eastwood et al. . |
| 3,905,094 | 9/1975 | Ruggiero . |
| 3,944,447 | 3/1976 | Magdo et al. . |
| 4,063,176 | 12/1977 | Milligan et al. . |
| 4,250,520 | 2/1981 | Denlinger . |
| 4,278,985 | 7/1981 | Stobbs . |

(List continued on next page.)

FOREIGN PATENT DOCUMENTS

| | | |
|---|---|---|
| 0029334 | 5/1981 | European Pat. Off. . |
| 0057135 | 8/1982 | European Pat. Off. . |
| 0654799 | 11/1993 | European Pat. Off. . |
| 54-136176 | 10/1979 | Japan . |
| 56 148848 | 11/1981 | Japan . |
| 63-047972 | 2/1988 | Japan . |
| 63-288062 | 11/1988 | Japan . |
| 2067354 | 7/1981 | United Kingdom . |
| 2187598 | 9/1987 | United Kingdom . |
| 90/05997 | 5/1990 | WIPO . |
| 90/15438 | 12/1990 | WIPO . |

OTHER PUBLICATIONS

PCT Search Report for International Application No. PCT/US95/06929, 7 pages (Aug. 31, 1995).

Richmond, D., *Micro SMT Discrete Device White Paper*, Micro SMT, Inc., pp. 1–14 (May 1, 1993).

Richmond, D., *Micro SMT Integrated Circuit Technical White Paper*, Micro SMT, Inc., pp. 1–15 (Jan. 25, 1993).

"Micro SMT, Inc. Announces A Revolutionary IC Packaging Process," *U.S. Electronics Management Report*, vol. 2, Issue 3, pp. 1–3 (Mar. 1993).

Micro SMT Incorporated, Brochure, two sheets (1993).

(List continued on next page.)

*Primary Examiner*—Brian Dutton
*Attorney, Agent, or Firm*—Blakely, Sokoloff, Taylor & Zafman LLP

[57] ABSTRACT

The fabrication of a resistor structure is described. A resistive region is formed over the top of a substrate. Trenches are formed from the top side of the substrate in scribe line regions where the wafer is to be separated to form resistor modules. Contact layers are formed over the top side of the substrate and are electrically coupled to each end of the resistive region, respectively. The contact layers are also formed over the sidewalls of the trenches. The wafer is separated through the trenches, creating resistor modules having sidewall contact regions.

13 Claims, 7 Drawing Sheets

U.S. PATENT DOCUMENTS

| | | |
|---|---|---|
| 4,321,616 | 3/1982 | Bise . |
| 4,529,960 | 7/1985 | Uchida et al. . |
| 4,577,213 | 3/1986 | Bauhahn . |
| 4,639,391 | 1/1987 | Kuo . |
| 4,683,646 | 8/1987 | Kando et al. . |
| 4,708,060 | 11/1987 | Bickes, Jr. et al. . |
| 4,725,810 | 2/1988 | Foroni et al. . |
| 4,733,290 | 3/1988 | Reardon et al. . |
| 4,738,933 | 4/1988 | Richards . |
| 4,760,369 | 7/1988 | Tiku . |
| 4,780,424 | 10/1988 | Holler et al. . |
| 4,788,523 | 11/1988 | Robbins . |
| 4,792,781 | 12/1988 | Takahashi et al. . |
| 4,811,080 | 3/1989 | Richards . |
| 4,835,588 | 5/1989 | Nawata et al. ............................ 357/36 |
| 4,855,796 | 8/1989 | Wong et al. . |
| 4,859,629 | 8/1989 | Reardon et al. . |
| 4,866,499 | 9/1989 | Aktik . |
| 4,893,166 | 1/1990 | Geekie . |
| 4,905,071 | 2/1990 | Chalifour et al. . |
| 4,976,200 | 12/1990 | Benson et al. . |
| 4,999,684 | 3/1991 | Temple ..................................... 357/13 |
| 5,006,421 | 4/1991 | Yang et al. . |
| 5,024,966 | 6/1991 | Dietrich et al. . |
| 5,034,801 | 7/1991 | Fischer . |
| 5,045,503 | 9/1991 | Kobiki et al. . |
| 5,081,473 | 1/1992 | Hawkins et al. . |
| 5,111,179 | 5/1992 | Flassayer et al. . |
| 5,117,280 | 5/1992 | Adachi . |
| 5,122,777 | 6/1992 | Shiratsuki et al. . |
| 5,162,258 | 11/1992 | Lemnios et al. . |
| 5,244,536 | 9/1993 | Tani et al. . |
| 5,268,310 | 12/1993 | Goodrich et al. . |
| 5,280,194 | 1/1994 | Richards et al. . |
| 5,287,083 | 2/1994 | Person et al. . |
| 5,294,910 | 3/1994 | Tani et al. . |
| 5,300,461 | 4/1994 | Ting . |
| 5,422,298 | 6/1995 | Jimenez . |
| 5,466,484 | 11/1995 | Spraggins et al. . |
| 5,563,572 | 10/1996 | Hetzler . |

OTHER PUBLICATIONS

Marcoux, P.P., et al., "Miniature SMD Packaging Simplified." *Electronic Packaging & Production*, pp. 74–75 (Jan. 1993).

Japanese article that refers to Micro SMT, pp. 163–169 (1993).

M–Pulse Microwave Brochure, "Micro Surface Mount Packages," one sheet (1993).

Gardner, F., "SM: Nobody said it would be this hard," *Electronic Purchasing*, pp. 63S and 65S (Oct. 1992).

*MicroElectronics Digest*, p. 14 (Spring 1993).

*Manufacturing Market Insider*, p. 4 (Oct. 1992).

"Leadless monolithic Devices are Drop–In Replacements for Beam Lead Devices," *Microwave Journal*, vol. 32, No. 8, pp. 173–174 (Aug. 1989).

M/A–COM Advertisement, one sheet (1992).

Costlow, T., "IC package custs cost, size," *EE Times*, one sheet (Aug. 3, 1992).

Alpha Industries, Inc., 6 sheets of drawings that refer to "DATE Feb. 12, 1990. "

M–Pulse Microwave brochure, "Package Dimensions," four sheets (1981).

M–Pulse Microwave Brochure, "Microwave Schottky Ring Quads," four sheets (1989).

M–Pulse Microwave Brochure, "Series Pin Switching Elements," two sheets (1989).

M–Pulse Microwave Brochure, "Microwave Schottky Diodes," one sheet (1988).

M–Pulse Microwave Brochure, "Zero Bias Schottky Diodes," one sheet (1988).

M–Pulse Microwave Brochure, "Outline Dimensions," one sheet (1988).

Garceau, W.J., et al., "Modified Beam Lead Magnets for Handling Semiconductors," Western Electric Technical Digest, No. 51, pp. 11–12 (Jul. 1978).

Boylesad, R., et al., Electronic Devices and Circuit Theory, Prentice–Hall, Inc., pp. v–xi, 1–24, 63–65, 82–87, 145–147, 462–488 (3rd Ed. 1982).

Gambling, W.A., Microwave Semiconductor Devices, Electronic Engineerig Series, pp. 105–108 (1972).

Laverghetta, T.S., Solid–State Microwave Devices, Artech House, Inc., pp. 1–117, 178–188 (1987).

White, J.F., Microwave Semiconductor Engineering, Van Nostrand Reinhold Company Inc., pp. vii–xvii, 39–115, 364–369 (1982).

M–Pulse Microwave Advertisement, Microwaves & RF, vol. 27, No. 5, pp. 8–9 (May 1988).

Metelics Advertisement, *Microwaves & RF*, vol. 27, No. 5, p. 262 (May 1988).

M–Pulse Microwave Brochure, "PIN Diodes," one sheet (1988).

M–Pulse Microwave Brochure, "Hybrid Schottky Barrier Diodes (General Purpose)," one sheet (1988).

M–Pulse Microwave Brochure, "Step Recovery Diodes," one sheet (1988).

M–Pulse Microwave Brochure, "Microwave Tunnel Diodes," one sheet (1988).

M–Pulse Microwave Brochure, "MNOS Chip Capacitors," one sheet (1988).

M–Pulse Microwave Brochure, "Techniques for Hybrid Assembly (Application Note 220)," one sheet (1988).

RESISTOR FABRICATION

This is a divisional of application Ser. No. 08/257,726, filed Jun. 9, 1994, now abandoned.

FIELD OF THE INVENTION

The present invention relates generally to the field of electrical devices. More particularly, the present invention relates to the field of resistor fabrication.

BACKGROUND OF THE INVENTION

Typical microwave electrical devices have bonding pads on the top of the device to provide connections to external circuitry. Bonding wires are connected to these bonding pads to provide these connections. These bonding wires are typically fragile. They are susceptible to breaking when subjected to relatively high external forces or when placed under high pressure.

Other prior microwave electrical devices have beam leads on the top of the device to provide connections to external circuitry. These beam leads, however, are also relatively fragile.

The frailty of bonding wires or beam leads has a number of drawbacks. For example, resistors are typically used in air bag devices to protect people when involved in a motor vehicle collision. Resistors provide an explosive trigger when injected with a relatively high current, igniting explosive material to activate the air bag. Resistors thus provide a vital role for air bag devices.

In manufacturing air bag devices, resistors are subjected to relatively high external forces and pressure. A slurry is typically packed around the resistor in a relatively high pressure environment that can cause the bonding wires or beam leads attached to the resistors to break. Such breakage can result in the air bag not activating when needed in a collision.

Air bag devices may be provided with circuitry to continually monitor the resistors, ensuring they are properly connected to activate the air bag. The bonding wires or beam leads of the resistors may break after installation of the air bag device in an automobile or even after the sale of the automobile to a customer. This leads to increased costs for the manufacturer as new air bag devices must be reinstalled.

Redundant bonding wires or beam leads may be used to better ensure the resistors will activate the air bag. For example, 4 or 6 or 8 bonding wires may be connected to a single bonding pad of a resistor in hope that one of the bonding wires will not break when the slurry is packed around the resistor. This redundancy technique may reduce the number of faulty air bag devices at the time of manufacture. The bonding wires or beam leads may nevertheless break after installation or sale of the air bag device.

BRIEF SUMMARY AND OBJECTS OF THE INVENTION

One of the objects of the present invention is to provide an electrical apparatus that is relatively durable and reliable.

Another object of the present invention is to provide an electrical apparatus with a durable and reliable contact interface.

A further object of the present invention is to provide an electrical apparatus with a contact interface that can withstand external forces.

A further object of the present invention is to provide an electrical apparatus with a sidewall contact interface.

A further object of the present invention is to provide for a resistor apparatus with a sidewall contact interface that is both durable and reliable and that can withstand external forces.

A method for fabricating an electrical apparatus with a wafer having a substrate is described. The substrate has a first side and a second side. A resistive region is formed over the first side of the substrate. A trench having a sidewall is formed over the first side of the substrate. A contact layer having a first material is formed over the sidewall of the trench and over a portion of the resistive region. The wafer is separated through the trench.

An electrical apparatus that includes a substrate having a top side, a first sidewall, and a second sidewall is also described. The apparatus includes a resistive region formed over the top side of the substrate. The apparatus includes a first contact layer having a first material formed over a first portion of the resistive region and over a portion of the first sidewall of the substrate, and a second contact layer having a second material formed over a second portion of the resistive region and over a portion of the second sidewall of the substrate.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The following detailed description sets forth a specific embodiment or embodiments in accordance with the present invention for resistor fabrication. In the following description, numerous specific details are set forth such as specific materials, processing sequences, etc., in order to provide a thorough understanding of the present invention. It will be evident, however, to one of ordinary skill in the art that the present invention may be practiced without these specific details. In other instances, well-known processing steps, equipment, etc., have not been described in particular detail so that the present invention is not unnecessarily obscured.

Figure 1:
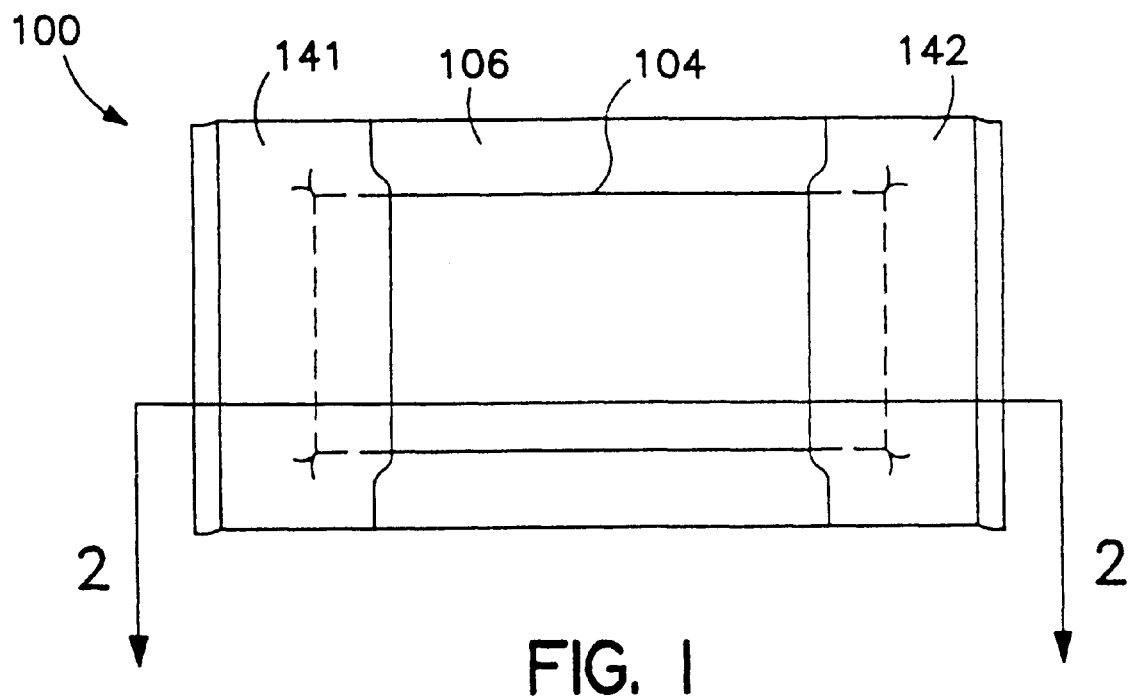
FIG. 1 illustrates a top view of a resistor module.
Figure 2:
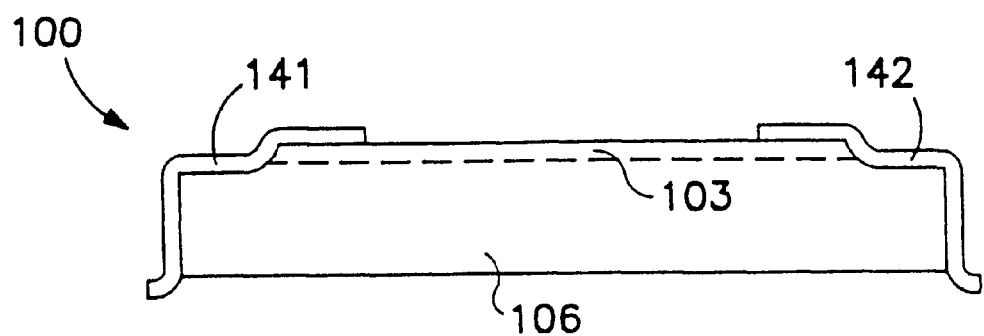
FIG. 2 illustrates a cross-sectional side view along line 2—2 of the resistor module of FIG. 1.

FIG. 1 illustrates a top view of a resistor module 100, which is one embodiment of the present invention. FIG. 2 illustrates a cross-sectional side view along line 2—2 of resistor module 100. Resistor module 100 is also referred to as an apparatus, an electrical apparatus, and a device, for example.

Resistor module 100 includes substrate 106. Substrate 106 may be a silicon (Si) substrate, for example, that includes a $N^{--}$ substrate region. A variety of other types of semiconductor substrates may also be used in practicing the present invention.

Resistor module 100 also includes a resistive region 103. Resistive region 103 is also referred to as a resistive layer. Resistive region 103 is electrically coupled to two contact regions 141–142. Resistive region 103 may be created, for example, using an ion implant process. Resistive region 103 may be an N semiconductor region 103 over an $N^{--}$ semiconductor region 106, for example. Semiconductor region 103 serves as a resistive material and may have any suitable resistivity value. Resistive region 103 has a relatively low resistivity as compared to that of substrate 106. Resistive region 103 resides in a mesa structure 104 of resistor module 100. Mesa structure 104 is rectangular in shape from a top view of resistor module 100, as illustrated in FIG. 1.

Contact regions 141–142 are also referred to as contact layers. Contact regions 141–142 extend from resistive region 103 on the top side of resistor module 100 over a sidewall at respective ends of resistor module 100. Contact regions 141–142 are the connection points for resistor module 100 to external circuitry. Contact regions 141–142 both have a relatively large surface area to help ensure good contact to external circuitry.

Contact regions 141–142 may be comprised of titanium-tungsten (Ti—W) and nickel (Ni) for one embodiment. Ni is preferable as Ni is well-suited for soldering. These Ni contact layers may be subsequently coated, for example, with a thin layer of gold (Au). Such a coating may serve to prevent the corrosion or oxidation of the Ni contact layers without destroying the soldering ability of Ni. For another embodiment, gold (Au) may be used in place of Ni. Contact regions 141–142 may include other conductive materials as well. For example, aluminum (Al) or copper (Cu) may be used. Indium titanium oxide (ITO) or gold tin oxide (ATO) may also be used. Other metals or combinations of materials including metals may also be used.

The bottom side of resistor module 100 may be substantially planar and flat. Contact regions 141–142 may extend below the bottom side of substrate 106, may be substantially flush with the surface of the bottom side of substrate 106, or may extend only partially along the sidewalls of resistor module 100.

Resistor module 100 may be attached across circuit gaps using either solder or conductive epoxy. Resistor module 100 can be configured to be a replacement for present beam lead or bonding wire devices. Alternatively, resistor module 100 can be made smaller or larger to address a custom requirement. The design of resistor module 100 allows the device to be made relatively small.

The fact that contact regions 141–142 have relatively high surface areas helps to improve the durability and reliability of connections to resistor module 100. The connection scheme with respect to resistor module 100 helps to improve the ability of resistor module 100 to withstand relatively high external forces.

Resistor module 100 may thus be used as a trigger for air bag devices. The connections to resistor module 100 can be made relatively resistant to breakage when slurry is packed around resistor module 100 in a relatively high pressure environment.

Resistor module 100 may be used for other purposes as well. Resistor module 100 may be used as an RF resistor, for example.

Figure 3:
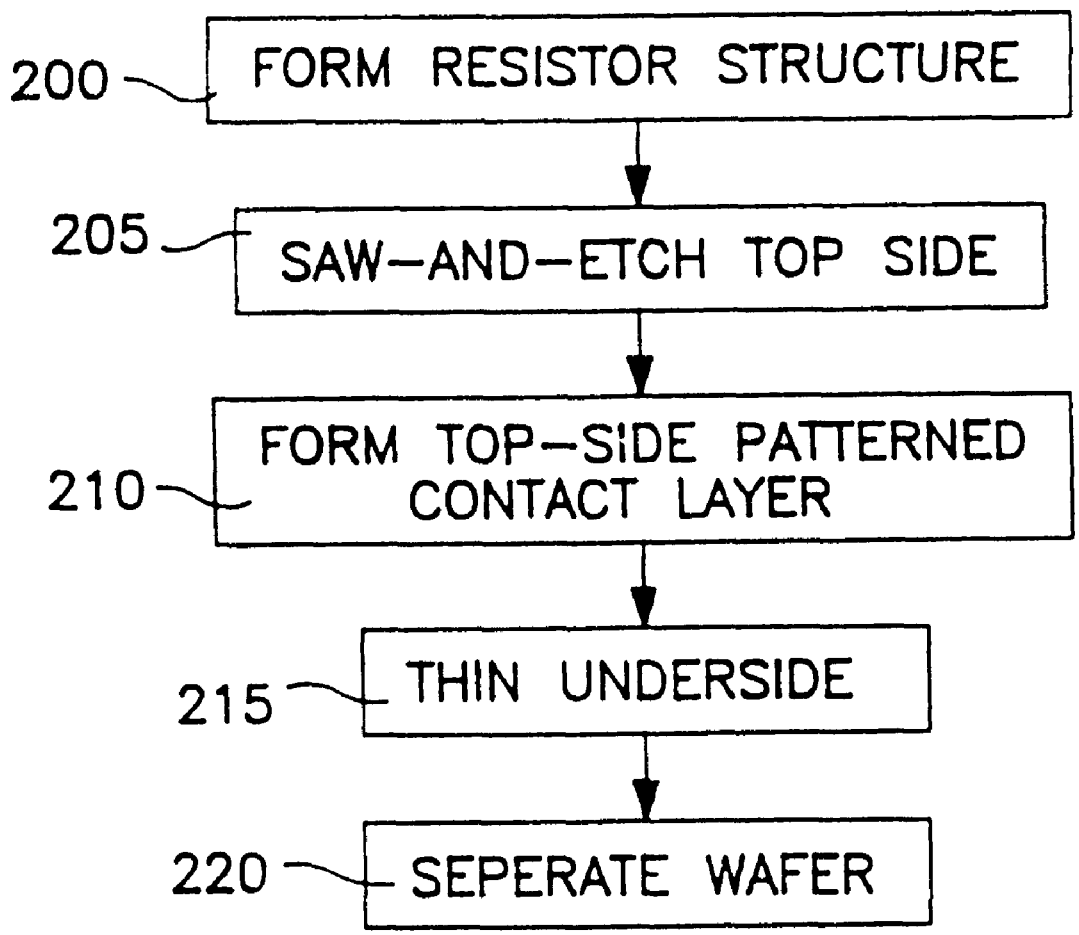
FIG. 3 illustrates, in flow diagram form, one method used in fabricating the resistor module of FIG. 1.

FIG. 3 illustrates, in flow diagram form, one method used in fabricating a resistor module. The method of FIG. 3 may be used to fabricate resistor module 100 for example. To better explain the method of FIG. 3, FIGS. 4–12 will be used to illustrate the various steps of the method of FIG. 3.

Figure 4:
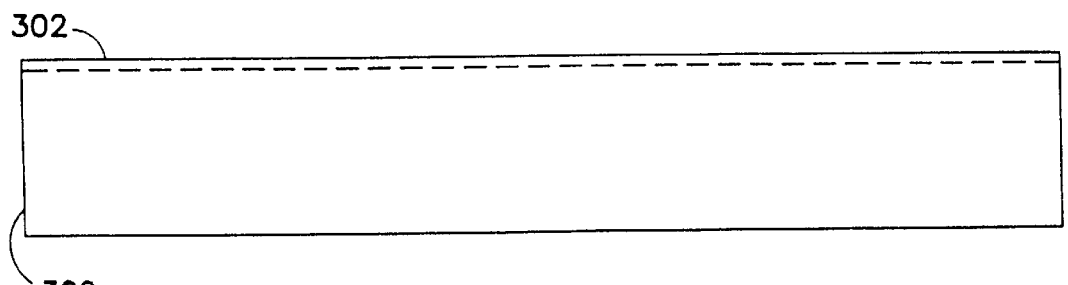
FIG. 4 illustrates a cross-sectional side view of a wafer used to fabricate the resistor module of FIG. 1.

FIG. 4 illustrates a cross-sectional side view of a wafer used to fabricate the resistor module of FIG. 1. For one embodiment, a semiconductor substrate is provided to perform the method of FIG. 3. This substrate is illustrated, for example, in FIG. 4 as substrate 300. Substrate 300 may be a silicon (Si) substrate, for example, that includes a $N^{--}$ substrate region. A variety of other types of semiconductor substrates may also be used in practicing the present invention.

Substrate 300 may be used to fabricate any suitable number of resistor structures 100 that may depend, for example, on the size of substrate 300. FIGS. 4–12 illustrate the fabrication of three resistor modules using substrate 300. This number of devices is exemplary and has been chosen to provide for a clearer understanding of the present invention.

For step 200 of FIG. 3, substrate 300 is used to fabricate a resistor structure. For one embodiment, an ion implant process is used to fabricate a resistor structure. This is illustrated in FIG. 4. Substrate 300 is implanted with a desired number of ions to create region 302 on the surface of substrate 300. The number of ions implanted into substrate 300 determines the level of resistivity for region 302. Substrate 300 may then be annealed to activate the ions. Region 302 has a relatively low resistivity as compared to that of substrate 300.

An ion implant may be used to create an N semiconductor region 302 over an $N^{--}$ semiconductor region 300, for example. N semiconductor region 302 may have a resistivity in the range of approximately 1–4 ohms, for example. Substrate 300 may be subjected to any suitable ion implant process and may be used to create a region 302 having any suitable resistivity value. Resistive region 302 is also referred to as a resistive layer.

Figure 5:
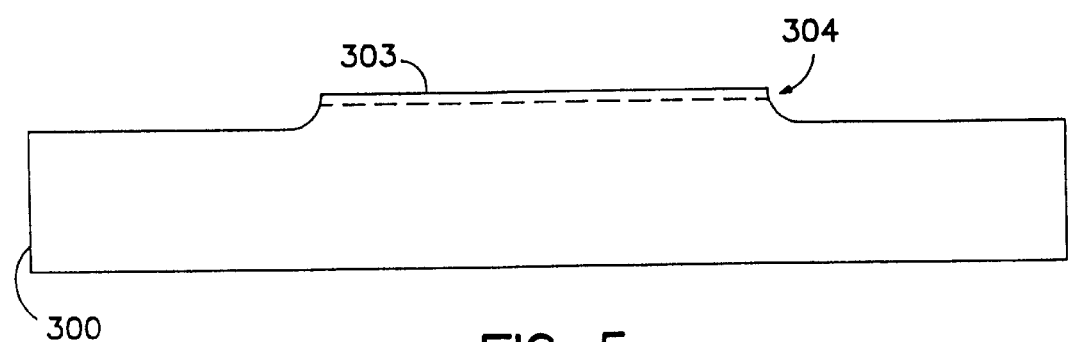
FIG. 5 illustrates a cross-sectional side view of the wafer of FIG. 4 after a mesa structure has been formed over the wafer.

For one embodiment, a mesa structure 304 may be formed over substrate 300, as illustrated in FIG. 5. FIG. 5 illustrates a cross-sectional side view of the wafer of FIG. 4 after mesa structure 304 has been formed over the wafer. Mesa structure 304 includes resistive region 303. Mesa structure 304 may be formed using a suitable etch technique to remove portions of resistive region 302 from each region of substrate 300 from which a resistor module will be fabricated. Mesa structure 304 is rectangular in shape from a top view, as illustrated in FIG. 1. Mesa structure 304 may have other shapes as well. Resistive region 303 of mesa structure 304 remains from resistive region 302 after substrate 300 has been etched. Resistive region 303 is also referred to as a resistive layer.

For another embodiment for step 200 of FIG. 3, the resistive region may be formed by forming a patterned mask layer over substrate 300 and subjecting the wafer to a suitable ion implant process to create resistive regions in exposed portions of substrate 300. This mask layer may include any suitable material such as photoresist, for example, and may be formed using any suitable technique. The mask layer prevents covered portions of substrate 300 from being doped and may be removed using any suitable technique.

Suitable ohmic contacts may be formed over portions of the resistor structure where the resistive region is to be contacted. For example, suitable ohmic contacts may be formed over portions of resistive region 103 that are to be contacted by contact regions 141–142 as illustrated in FIGS. 1–2.

Suitable ohmic contacts may be formed after the resistor structure has been formed for step 200 of FIG. 3. For one embodiment where mesa structure 304 with resistive region 303 has been formed for the resistor structure, suitable ohmic contacts may be formed after resistive region 302 has been formed over substrate 300 and just prior to the formation of mesa structure 304. Any suitable ohmic contact technique may be used. For example, ohmic contact material such as nickel, palladium silicide, or platinum silicide, for example, may be deposited over the wafer and patterned using suitable photolithography and etch techniques, for example. The ohmic contact material may depend, for example, upon whether resistive region 302 has been doped with boron or phosphorous.

Figure 6:
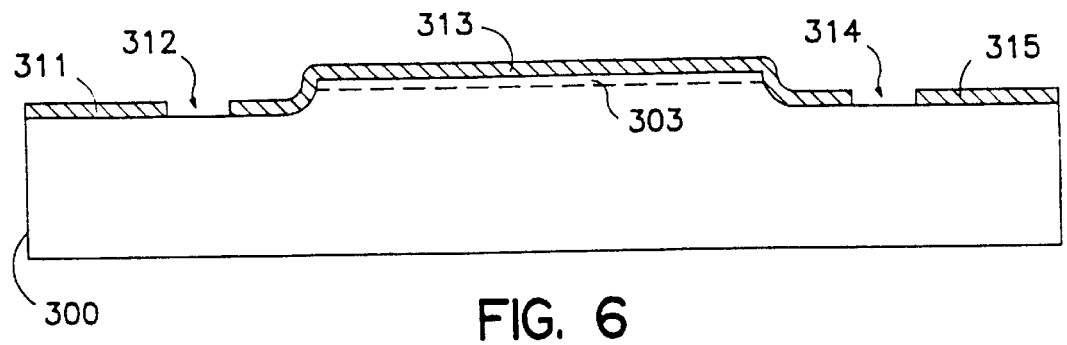
FIG. 6 illustrates a cross-sectional side view of the wafer of FIG. 5 after a mask layer has been formed over the wafer.

For step 205 of FIG. 3, the wafer is subjected to a saw-and-etch process to form trenches over the wafer. For one embodiment, a mask layer is first formed over the wafer and patterned into mask regions 311, 313, and 315 as illustrated in FIG. 6. FIG. 6 illustrates a cross-sectional side view of the wafer of FIG. 5 after a mask layer including mask regions 311, 313, and 315 has been formed over the wafer.

In forming mask regions 311, 313, and 315, any suitable mask material may be used and may be formed and patterned over the wafer using any suitable technique. Mask regions 311, 313, and 315 may comprise photoresist, for example, that has been spun-on and patterned with photolithography techniques. Other suitable mask materials, including other photosensitive materials, may also be used here and may be formed and patterned over the wafer using any suitable technique.

Mask regions 311, 313, and 315 define scribe line regions 312 and 314 over the surface of the wafer. Scribe line regions 312 and 314 traverse the length of the wafer and run substantially parallel to one another. Scribe line regions 312 and 314 define where the wafer will be separated.

Figure 7:
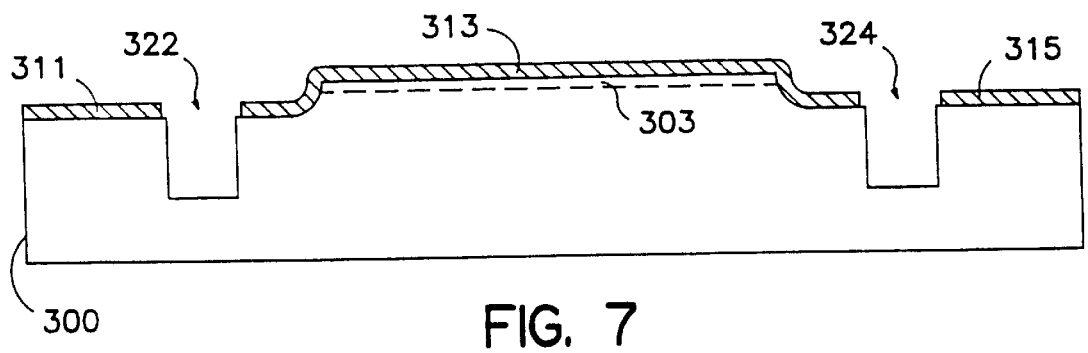
FIG. 7 illustrates a cross-sectional side view of the wafer of FIG. 6 after the substrate of the wafer has been sawed.

The wafer is sawed along scribe line regions 312 and 314 to create pits 322 and 324 as illustrated in FIG. 7. FIG. 7 illustrates a cross-sectional side view of the wafer of FIG. 6 after the substrate of the wafer has been sawed. Scribe line regions 312 and 314, as defined by mask regions 311, 313, and 315, may serve as a guide in sawing pits 322 and 324.

For another embodiment, the mask layer is not initially patterned into mask regions 311, 313, and 315. Rather, the mask material is formed over the wafer and then sawed to define mask regions 311, 313, and 315 while creating trenches 322 and 324.

The wafer is not entirely separated here in sawing the wafer to create pits 322 and 324, as illustrated in FIG. 7. Each pit 322 and 324 may have any suitable depth and width.

Figure 8:
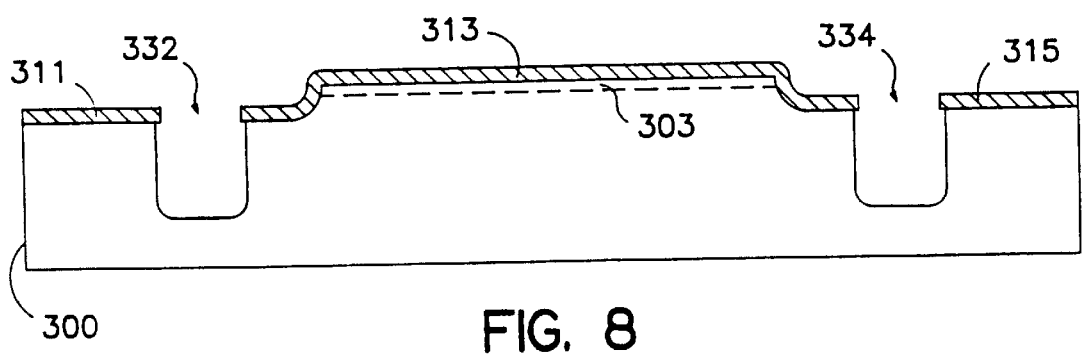
FIG. 8 illustrates a cross-sectional side view of the wafer of FIG. 7 after the substrate of the wafer has been etched.

After creating pits 322 and 324, substrate 300 is etched in scribe line regions 312 and 314 as defined by mask regions 311, 313, and 315 to create trenches 332 and 334. This is illustrated in FIG. 8. FIG. 8 illustrates a cross-sectional side view of the wafer of FIG. 7 after the substrate of the wafer has been etched. Any suitable etch technique and chemistry may be used here to create trenches 332 and 334.

For another embodiment, pits 322 and 324 are not created at all. Rather, trenches 332 and 334 are created by etching substrate 300 in scribe line regions 312 and 314 as defined by mask regions 311, 313, and 315. For this embodiment, any suitable etch technique and chemistry may be used here to create trenches 332 and 334 using mask regions 311, 313, and 315 as a mask.

Figure 9:
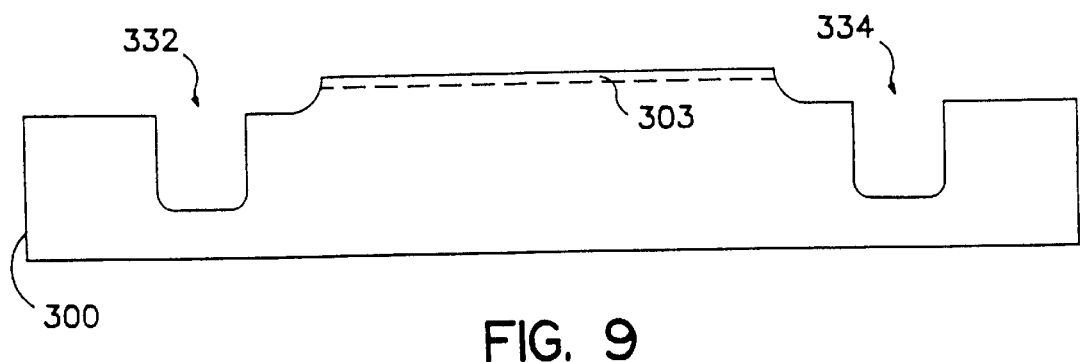
FIG. 9 illustrates a cross-sectional side view of the wafer of FIG. 8 after the mask layer has been removed.

After trenches 332 and 334 have been formed, mask regions 311, 313, and 315 are removed from the wafer as illustrated in FIG. 9. FIG. 9 illustrates a cross-sectional side view of the wafer of FIG. 8 after mask regions 311, 313, and 315 have been removed. Any suitable technique may be used here to remove mask regions 311, 313, and 315.

Figure 10:
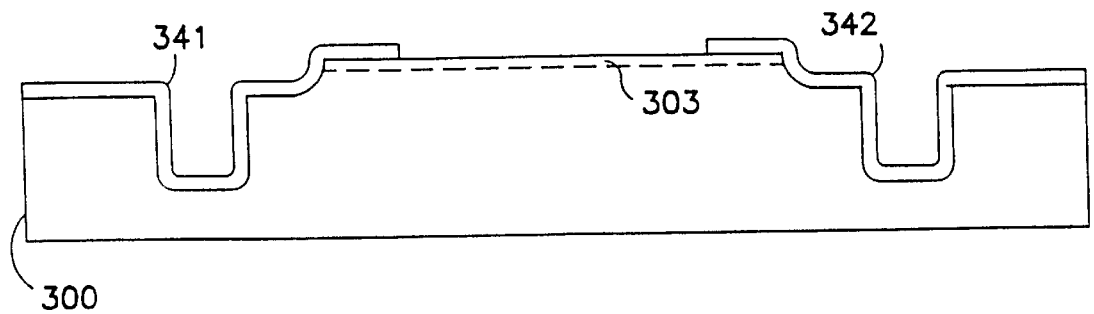
FIG. 10 illustrates a cross-sectional side view of the wafer of FIG. 9 after a patterned contact layer has been formed over the wafer.

For step 210 of FIG. 3, a patterned contact layer including contact regions 341–342 is formed over the wafer. This is illustrated in FIG. 10. FIG. 10 illustrates a cross-sectional side view of the wafer of FIG. 9 after a patterned contact layer has been formed over the wafer. Contact regions 341–342 are also referred to as contact layers.

For one embodiment, contact regions 341–342 are formed by first forming a conductor layer over the wafer. For example, titanium-tungsten (Ti—W) may be sputter deposited over the wafer. This Ti—W layer may serve to provide for a diffusion barrier layer for contact regions 341–342. Other diffusion barrier materials may also be used. Gold (Au) is then sputter deposited over the Ti—W layer. This Au layer may serve to facilitate the pattern plating of gold (Au) or nickel (Ni), for example, in forming contact regions 341–342. Alternatively, any suitable material or combination of materials may also be used in place these Ti—W and/or Au layers. For example, nickel (Ni) may be used in place of Au here to facilitate the pattern plating of Ni, for example, in forming contact regions 341–342. Furthermore, any suitable technique may be used to form the conductor layer here.

A patterned mask layer, for example comprising photoresist, may then be formed over the wafer. This patterned mask layer is used in pattern plating gold (Au) or nickel (Ni), for example, over the underlying barrier and conductor layers to create contact regions 341–342. After this pattern plating process, the patterned mask layer is removed. Portions of the underlying barrier and conductor layers that are exposed on the surface of the wafer may then be removed by etching, for example, leaving contact regions 341–342 as illustrated in FIG. 10.

Nickel (Ni) contact regions are preferable as Ni is well-suited for soldering. These Ni contact regions may be subsequently coated, for example, with a thin layer of gold (Au). Such a coating may serve to prevent the corrosion or oxidation of the Ni contact regions without destroying the soldering ability of Ni.

The contact material conforms to the contour of the surface of the wafer. Particularly, contact regions 341–342 are formed along the sides and bottom of trenches 332 and 334, respectively, as illustrated in FIG. 10. Contact regions 341–342 each traverse the length of the wafer.

Each contact region 341–342 also overlies an end portion of the resistive region, exposing a center portion of the resistive region. For one embodiment, each contact region 341–342 overlies a portion of resistive region 303 at each end of mesa structure 304, respectively, exposing a center portion of resistive region 303. Contact regions 341–342 are electrically coupled to resistive region 303. Contact regions 341–342 may extend to neighboring mesa structures to the left or right, respectively, of mesa structure 304.

Contact regions 341–342 may include other conductive materials as well. For example, aluminum (Al) or copper (Cu) may be used. Indium titanium oxide (ITO) or gold tin oxide (ATO) may also be used. Other metals or combinations of materials including metals may also be used. Furthermore, contact regions 341–342 may be formed using any suitable technique. For example, a layer of the material or materials used to create contact regions 341–342 may be deposited over the wafer and subsequently patterned to create contact regions 341–342. Photolithography and etch techniques, for example, may be used here to pattern contact regions 341–342.

Figure 11:
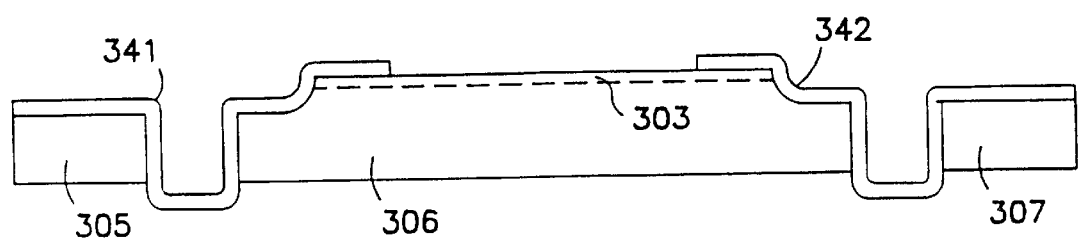
FIG. 11 illustrates a cross-sectional side view of the wafer of FIG. 10 after the underside of the substrate of the wafer has been thinned.

For step 215 of FIG. 3, the backside or underside of the wafer is thinned as illustrated in FIG. 11 as compared to the wafer illustrated in FIG. 10. FIG. 11 illustrates a cross-sectional side view of the wafer of FIG. 10 after the underside of the substrate of the wafer has been thinned.

The underside of substrate 300 may be thinned here using any suitable technique. For example, the underside of substrate 300 may be sandblasted. The underside of substrate 300 may also be etched using a suitable etch technique and chemistry.

The underside may be thinned to the extent that the bottom side of contact regions 341–342 is exposed through the underside of substrate 300, as illustrated in FIG. 11. This thinning may serve to separate substrate 300 into substrate regions 305, 306, and 307. Each substrate region 305, 306, and 307 traverses the length of the wafer. Alternatively, the underside may also be thinned such that the bottom side of contact regions 341–342 is not exposed through the underside of substrate 300. Substrate 300 will then be separated as discussed below.

Figure 12:
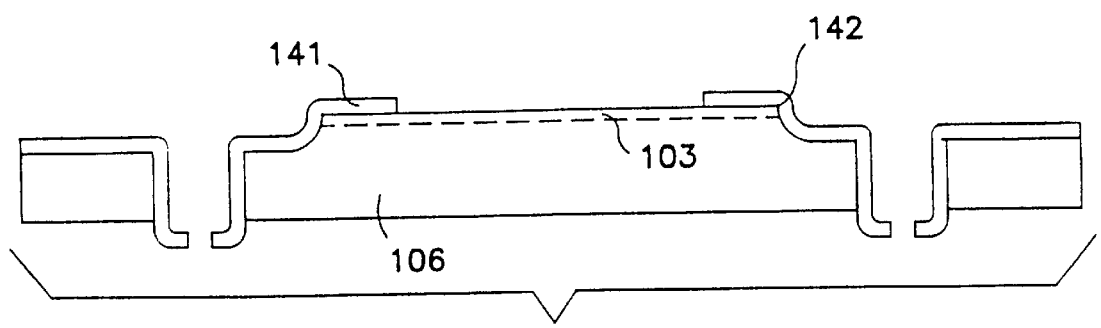
FIG. 12 illustrates a cross-sectional side view of the wafer of FIG. 12 after the wafer has been separated.

For step 220 of FIG. 3, the wafer is separated into resistor modules, as illustrated in FIG. 12. FIG. 12 illustrates a cross-sectional side view of the wafer of FIG. 11 after the wafer has been separated.

The wafer may be separated, for example, by sawing the wafer. The sawcut may have any suitable width. Other techniques may also be used to separate the wafer and include, for example, using a laser scribe.

The wafer is separated through, for example, trenches 332 and 334. The wafer is also separated along scribe line regions that run substantially orthogonal to trenches 332 and 334, separating semiconductor region 306 into separate resistor modules along the length of the wafer. Contact regions 341–342 are also separated for each resistor module fabricated from semiconductor region 306. Resistor modules may be similarly fabricated by separating semiconductor regions 305 and 307.

The reference numerals used in FIG. 12 correspond to those used for FIGS. 1–2 above.

The bottom side of resistor module 100 may be substantially planar and flat. Contact regions 141–142 may extend below the bottom side of substrate 106, may be substantially flush with the surface of the bottom side of substrate 106, or may extend only partially along the sidewalls of resistor module 100, depending upon the extent substrate 300 has been thinned for step 215 of FIG. 3.

Figure 13:
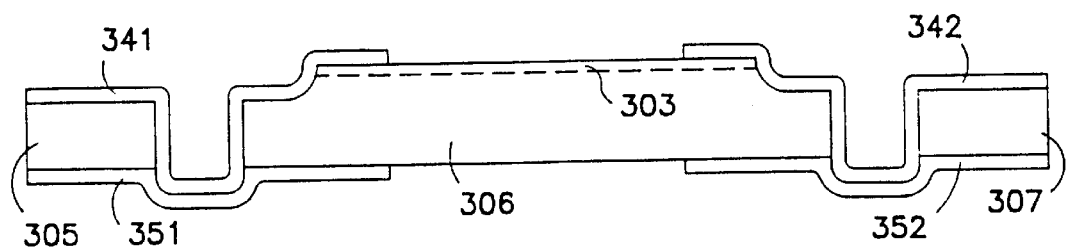
FIG. 13 illustrates, for an alternative embodiment, a cross-sectional side view of the wafer of FIG. 11 after a patterned contact layer has been formed over the underside of the wafer.

For an alternative embodiment, a patterned contact layer including contact regions 351–352 is formed over the underside of the wafer to fabricate resistor module 100. This is illustrated in FIG. 13. FIG. 13 illustrates, for this alternative embodiment, a cross-sectional side view of the wafer of FIG. 11 after contact regions 351–352 have been formed over the underside of the wafer. With respect to the method of FIG. 3, contact regions 351–352 may be formed over the underside of the wafer, for example, after step 215 of FIG. 3. Contact regions 351–352 are also referred to as contact layers.

For one embodiment, contact regions 351–352 are formed by first forming a conductor layer over the underside of the wafer. For example, titanium-tungsten (Ti—W) may be sputter deposited over the underside of the wafer. This Ti—W layer may serve to provide for a diffusion barrier layer for contact regions 351–352. Other diffusion barrier materials may also be used. Gold (Au) is then sputter deposited over the Ti—W layer. This Au layer may serve to facilitate the pattern plating of gold (Au) or nickel (Ni), for example, in forming contact regions 351–352. Alternatively, any suitable material or combination of materials may also be used in place these Ti—W and/or Au layers. For example, nickel (Ni) may be used in place of Au here to facilitate the pattern plating of Ni, for example, in forming contact regions 351–352. Furthermore, any suitable technique may be used to form the conductor layer here.

A patterned mask layer, for example comprising photoresist, may then be formed over the underside wafer. This patterned mask layer is used in pattern plating gold (Au) or nickel (Ni), for example, over the underlying barrier and conductor layers to create contact regions 351–352. After this pattern plating process, the patterned mask layer is removed. Portions of the underlying barrier and conductor layers that are exposed on the surface of the wafer may then be removed by etching, for example, leaving contact regions 351–352 as illustrated in FIG. 13.

Nickel (Ni) contact regions are preferable as Ni is well-suited for soldering. These Ni contact regions may be subsequently coated, for example, with a thin layer of gold (Au). Such a coating may serve to prevent the corrosion or oxidation of the Ni contact regions without destroying the soldering ability of Ni.

Contact regions 351–352 are formed along the underside of trenches 332 and 334, respectively, as illustrated in FIG. 13. Contact regions 351–352 each traverse the length of the wafer.

For one embodiment, portions of contact regions 351–352 form a durable and reliable surface-to-surface bond with exposed portions of contact regions 341–342, respectively, when contact regions 351–352 are formed over the underside of the wafer. Here, the material used for contact regions 341–342 that is exposed on the underside of the wafer after thinning is preferably the same as the material used for contact regions 351–352 that is to come in contact with contact regions 341–342.

For one embodiment, titanium-tungsten (Ti—W) is used as the first layer for each contact region 341–342 and 351–352. As a result, a durable and reliable intermetallic surface-to-surface bond is formed between contact regions 341 and 351 and between contact regions 342 and 352 for this embodiment. For other embodiments, another material in place of Ti—W may be used in creating these bonds. Using the same material here may facilitate the formation of a durable and reliable bond between contact regions 341–342 and 351–352, respectively. For still other embodiments, the materials used to bond contact regions 341–342 with contact regions 351–352 may be different.

Contact regions 351–352 may include other conductive materials as well. For example, aluminum (Al) or copper (Cu) may be used. Indium titanium oxide (ITO) or gold tin oxide (ATO) may also be used. Other metals or combinations of materials including metals may also be used. Furthermore, contact regions 351–352 may be formed using any suitable technique. For example, a layer of the material or materials used to create contact regions 351–352 may be deposited over the wafer and subsequently patterned to create contact regions 351–352. Photolithography and etch techniques, for example, may be used here to pattern contact regions 351–352.

Figure 14:
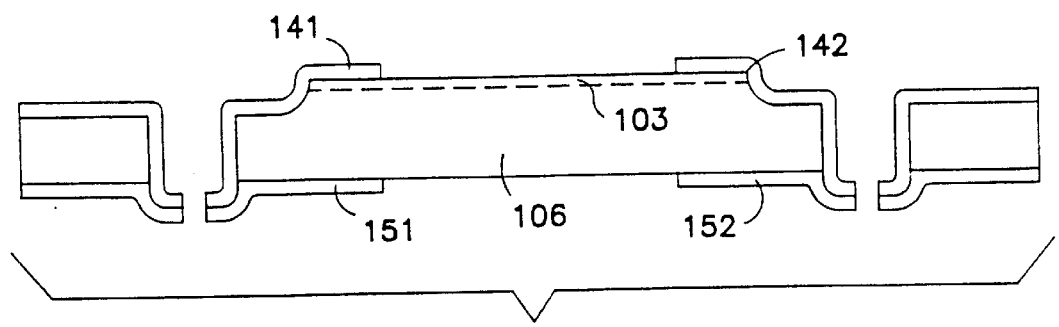
FIG. 14 illustrates, for an alternative embodiment, a cross-sectional side view of the wafer of FIG. 13 after the wafer has been separated.

For step 225 of FIG. 3 for this alternative embodiment, the wafer is separated into resistor modules, as illustrated in FIG. 14. FIG. 14 illustrates, for this alternative embodiment, a cross-sectional side view of the wafer of FIG. 13 after the wafer has been separated.

The wafer may be separated, for example, by sawing the wafer. The sawcut may have any suitable width. Other techniques may also be used to separate the wafer and include, for example, using a laser scribe.

The wafer is separated through, for example, trenches 332 and 334. The wafer is also separated along scribe line regions that run substantially orthogonal to trenches 332 and 334, separating semiconductor region 306 into separate resistor modules along the length of the wafer. Contact regions 341–342 and 351–352 are also separated for each resistor module fabricated from semiconductor region 306. Resistor modules may be similarly fabricated by separating semiconductor regions 305 and 307.

Contact regions 341–342 that have bonded with contact regions 351–352 form wrap-around contact regions as illustrated in FIG. 14. Bonded contact regions 341 and 351 and bonded contact regions 342 and 352 are separated in separating the wafer and create a wrap-around contact region for separate resistor modules fabricated from the wafer.

For this alternative embodiment, resistor module 100 is a leadless monolithic device that is configured for surface mounting, for example, over a printed circuit board. Contact regions 151–152 are the connection points for resistor module 100 to external circuitry. Contact regions 151–152 are both relatively flat on the underside of resistor module 100. Contact regions 151–152 are also both relatively large. These features help to ensure good contact to external circuitry. Contact regions 151–152 are also referred to as contact layers.

Because of contact regions 141–142 and 151–152, resistor module 100 provides for more durable and reliable connections to external circuitry. As contact regions 141–142 and contact regions 151–152 form wrap-around contact regions that have relatively higher surface areas, a more durable and reliable connection may be made to resistor module 100. Such a connection can better withstand relatively high external forces as compared to prior bonding wires or beam leads.

Figure 15:
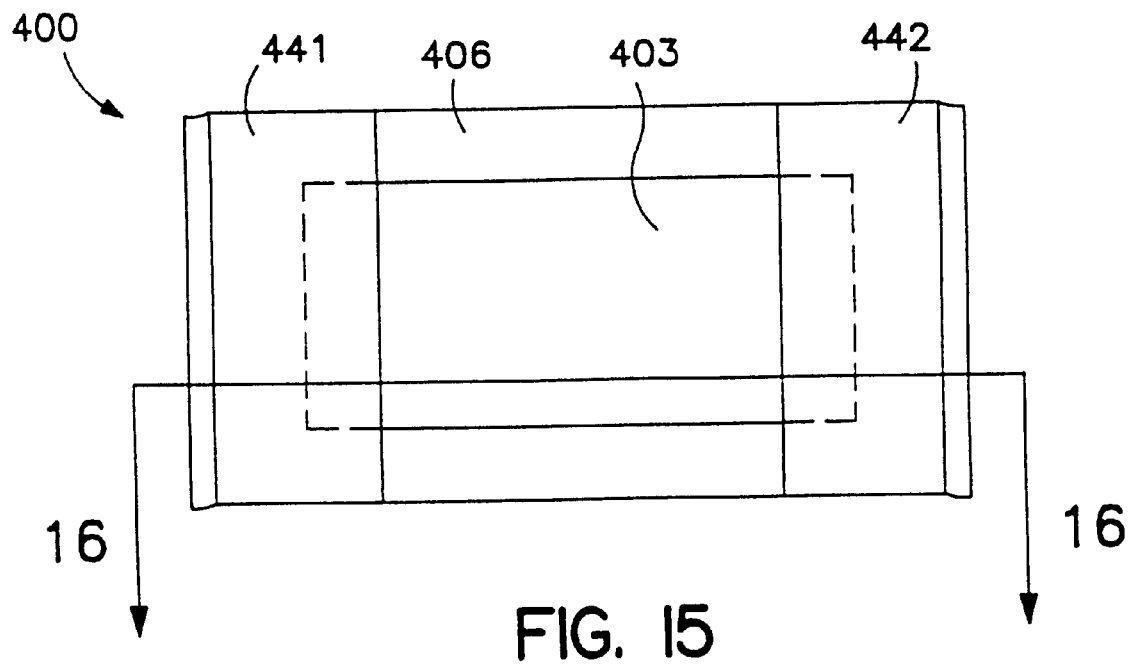
FIG. 15 illustrates a top view of a resistor module.
Figure 16:
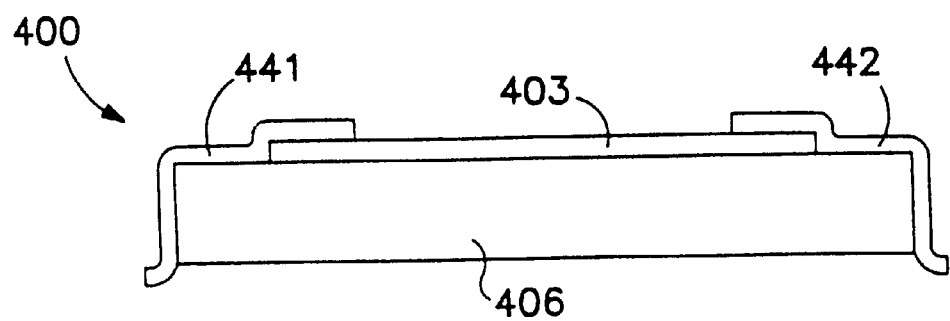
FIG. 16 illustrates a cross-sectional side view along line 16—16 of the resistor module of FIG. 15.

FIG. 15 illustrates a top view of a resistor module 400, which is another embodiment of the present invention. FIG. 16 illustrates a cross-sectional side view along line 16—16 of resistor module 400. Resistor module 400 is also referred to as an apparatus, an electrical apparatus, and a device, for example.

The method of FIG. 3 may be similarly used to fabricate resistor module 400. Resistor module 400 differs from resistor module 100 in its fabrication of a resistor structure for step 200 of the method of FIG. 3. The above discussion pertaining to resistor module 100 that is not inconsistent with the below discussion for resistor module 400 applies for resistor module 400, as well.

Resistor module 400 includes substrate 406, resistive region 403, and contact regions 441–442. Resistive region 403 is also referred to as a resistive layer.

For step 200 in fabricating resistor module 400, a resistive region 403 is patterned over substrate 406 to form the resistor structure. Resistive layer 403 is rectangular in shape from a top view of resistor module 400, as illustrated in FIG. 15. Resistive layer 403 may have other shapes as well.

Substrate 406 for resistor module 400 may comprise any suitable insulative, semi-insulative, or otherwise relatively high resistive material. Silicon (Si) or a ceramic material, for example, may be used.

To create patterned resistive layer 403, tungsten silicide (WSi$_2$), for example, may be deposited over substrate 406 and subsequently patterned, for example, using photolithography and etch techniques.

For another embodiment, an insulative layer including silicon dioxide (SiO$_2$), for example, may be formed over substrate 406 that includes silicon (Si). This insulative layer is subsequently patterned exposing the region over substrate 406 where resistive layer 403 is to be created. A metal, such as titanium (Ti) or cobalt (Co), is deposited over the wafer. The wafer is then heated, causing the metal to react with the silicon in substrate 406 to create a silicide layer. The metal does not react with portions of substrate 406 that are covered by the insulative layer. The metal may then be removed using an etchant that does not attack the silicide, substrate 406, or the insulative layer. The insulative layer may then be removed using suitable techniques. As a result, substrate 406 is covered with a silicide layer to serve as resistive layer 403. For this embodiment, resistive layer 403 may not be raised over the surface of substrate 406 as illustrated in FIG. 15. Rather, silicide layer 403 may be substantially flush with the surface of substrate 406.

Other suitable materials may also be used for resistive layer 403. Patterned resistive layer 403 may be formed over substrate 406 using other suitable techniques as well.

Depending upon the process used to create the resistor structure for step 200 of FIG. 3, suitable transfer materials including metals may be required to provide for an appropriate ohmic contact between the resistive region and the contact regions.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method for fabricating an electrical device from a wafer having a substrate, the substrate having a first side and a second side, the method comprising:

(a) forming a resistive region in the first side of the substrate by:

(i) subjecting the first side of the substrate to an ion implant process; and (ii) removing portions of the first side of the substrate such that the resistive region is formed;

(b) forming in the first side of the substrate a trench having a sidewall;

(c) forming a metal contact layer made of a first material over the sidewall of the trench and over a portion of the resistive region; and (d) separating the wafer through the trench.

2. The method of claim 1, wherein forming the trench includes etching the substrate such that the trench is formed.

3. The method of claim 1, wherein the resistive region forming step (a) includes:

(a)(i) forming a patterned mask layer over the first side of the substrate, and (a)(ii) subjecting the first side of the substrate to an ion implant process to form the resistive region in an exposed portion of the substrate.

4. The method of claim 1, wherein the resistive region forming step (a) includes:

(a)(i) forming a resistive material layer having a second material over the substrate, and (a)(ii) patterning the resistive material layer to form the resistive region.

5. The method of claim 4, wherein the second material includes tungsten silicide.

6. The method of claim 1, wherein the resistive region forming step (a) includes:

(a)(i) forming a patterned layer over the first side of the substrate, (a)(ii) forming a material layer having a second material over the patterned mask layer, and (a)(iii) heating the substrate to form the resistive region in the substrate.

7. The method of claim 1, wherein forming the trench includes:

(b)(i) sawing the first side of the wafer in a region where the trench is to be formed, and (b)(ii) etching the substrate such that the trench is formed.

8. The method of claim 1, wherein the first material includes nickel, gold, copper, or aluminum.

9. The method of claim 1, further comprising removing a portion of the substrate from the second side of the substrate such that the electrical apparatus has a substantially planar bottom side after the wafer has been separated.

10. The method of claim 1, further comprising removing a portion of the substrate from the second side of the substrate such that a portion of the metal contact layer formed in the trench is exposed through the second side of the substrate.

11. The method of claim 10, further comprising forming a second metal contact layer having a second material over the second side of the substrate such that the second metal contact layer is electrically coupled to the portion of the metal contact layer formed in the trench that is exposed through the second side of the substrate.

12. The method of claim 11, wherein the second material includes nickel, gold, copper, or aluminum.

13. The method of claim 1, wherein separating the wafer through the trench comprises sawing the wafer through the trench.

* * * * *